United States Patent
Noda et al.

(10) Patent No.: US 11,973,318 B2
(45) Date of Patent: Apr. 30, 2024

(54) LIGHT EMITTING DEVICE AND PROJECTOR

(71) Applicants: SEIKO EPSON CORPORATION, Tokyo (JP); SOPHIA SCHOOL CORPORATION, Tokyo (JP)

(72) Inventors: Takafumi Noda, Matsumoto (JP); Shunsuke Ishizawa, Tokyo-to (JP); Katsumi Kishino, Akiruno (JP)

(73) Assignees: SEIKO EPSON CORPORATION, Tokyo (JP); SOPHIA SCHOOL CORPORATION, Tokyo (JP)

( * ) Notice: Subject to any disclaimer, the term of this patent is extended or adjusted under 35 U.S.C. 154(b) by 381 days.

(21) Appl. No.: 17/499,847

(22) Filed: Oct. 12, 2021

(65) Prior Publication Data
US 2022/0115843 A1 Apr. 14, 2022

(30) Foreign Application Priority Data
Oct. 13, 2020 (JP) .................................. 2020-172418

(51) Int. Cl.
| | |
|---|---|
| H01S 5/343 | (2006.01) |
| G03B 21/20 | (2006.01) |
| H01S 5/11 | (2021.01) |
| H01S 5/185 | (2021.01) |
| H01S 5/02 | (2006.01) |
| H01S 5/042 | (2006.01) |

(52) U.S. Cl.
CPC ............ *H01S 5/34333* (2013.01); *H01S 5/11* (2021.01); *H01S 5/185* (2021.01); *H01S 5/34346* (2013.01); *G03B 21/2033* (2013.01); *H01S 5/0218* (2013.01); *H01S 5/04257* (2019.08)

(58) Field of Classification Search
CPC .................................................... H01S 5/34333
See application file for complete search history.

(56) References Cited

U.S. PATENT DOCUMENTS

| | | | |
|---|---|---|---|
| 2005/0095768 A1* | 5/2005 | Tsuda ..................... | B82Y 20/00 438/200 |
| 2011/0169025 A1 | 7/2011 | Kishino et al. | |
| 2012/0043528 A1* | 2/2012 | Lo ........................... | H01L 33/16 257/E29.073 |
| 2017/0194476 A1* | 7/2017 | Brueck ............. | H01L 21/02494 |
| 2020/0036163 A1* | 1/2020 | Nishioka ................... | H01S 5/11 |

FOREIGN PATENT DOCUMENTS

| | | |
|---|---|---|
| JP | 2013062346 | 4/2013 |
| JP | 2013239718 | 11/2013 |

* cited by examiner

*Primary Examiner* — Sean P Hagan
(74) *Attorney, Agent, or Firm* — JCIPRNET

(57) ABSTRACT

A light emitting device includes a substrate, and a laminated structure provided to the substrate, and including a columnar part, wherein the columnar part includes a first GaN layer having a first conductivity type, a second GaN layer having a second conductivity type different from the first conductivity type, and a light emitting layer disposed between the first GaN layer and the second GaN layer, the first GaN layer is disposed between the substrate and the light emitting layer, the light emitting layer has a first well layer as an InGaN layer, the first GaN layer has a c-face region, the first GaN layer has a crystal structure of a cubical crystal, and has a first layer constituting the c-face region, and a second layer as a GaN layer having a crystal structure of a hexagonal crystal is disposed between the first layer and the first well layer.

7 Claims, 5 Drawing Sheets

LIGHT EMITTING DEVICE AND PROJECTOR

The present application is based on, and claims priority from JP Application Serial Number 2020-172418, filed Oct. 13, 2020, the disclosure of which is hereby incorporated by reference herein in its entirety.

BACKGROUND

1. Technical Field

The present disclosure relates to a light emitting device and a projector.

2. Related Art

Semiconductor lasers are promising as high-luminance next-generation light sources. In particular, a semiconductor laser to which nano-columns are applied is expected to be able to realize narrow-radiation angle high-power light emission due to an effect of a photonic crystal derived from the nano-columns.

For example, in JP-A-2013-239718 (Document 1), there is described a semiconductor photonic device array provided with nano-columns including a fine column crystal including an n-type cladding layer growing above a mask pattern, an active layer, and a p-type semiconductor layer. In Document 1, a facet face is formed in a tip portion of the fine column crystal, and the facet face is coated with the active layer.

However, when the active layer is formed on the facet face, In in an InGaN layer included in the active layer is agglutinated at the center of the facet face. When such agglutination occurs, the balance of the distortion is lost in an in-plane direction of the active layer, and a crystal defect occurs.

Therefore, it is conceivable to dispose a GaN layer as a cubical crystal having the c face in order to planarize the tip of the fine column crystal. However, since the GaN layer as the cubical crystal is high in lattice constant difference from the InGaN layer, there occurs a crystal defect caused by the lattice constant difference between the both layers.

SUMMARY

A light emitting device according to an aspect of the present disclosure includes substrate, and a laminated structure provided to the substrate, and including a columnar part, wherein the columnar part includes a first GaN layer having a first conductivity type, a second GaN layer having a second conductivity type different from the first conductivity type, and a light emitting layer disposed between the first GaN layer and the second GaN layer, the first GaN layer is disposed between the substrate and the light emitting layer, the light emitting layer has a first well layer as an InGaN layer, the first GaN layer has a c-face region, the first GaN layer has a crystal structure of a cubical crystal, and has a first layer constituting the c-face region, and a second layer as a GaN layer having a crystal structure of a hexagonal crystal is disposed between the first layer and the first well layer.

A projector according to another aspect of the present disclosure includes the light emitting device according to the above aspect.

DESCRIPTION OF AN EXEMPLARY EMBODIMENT

A preferred embodiment of the present disclosure will hereinafter be described in detail using the drawings. It should be noted that the embodiments described hereinafter do not unreasonably limit the contents of the present disclosure as set forth in the appended claims. Further, all of the constituents described hereinafter are not necessarily essential elements of the present disclosure.

1. Light Emitting Device

Figure 1:
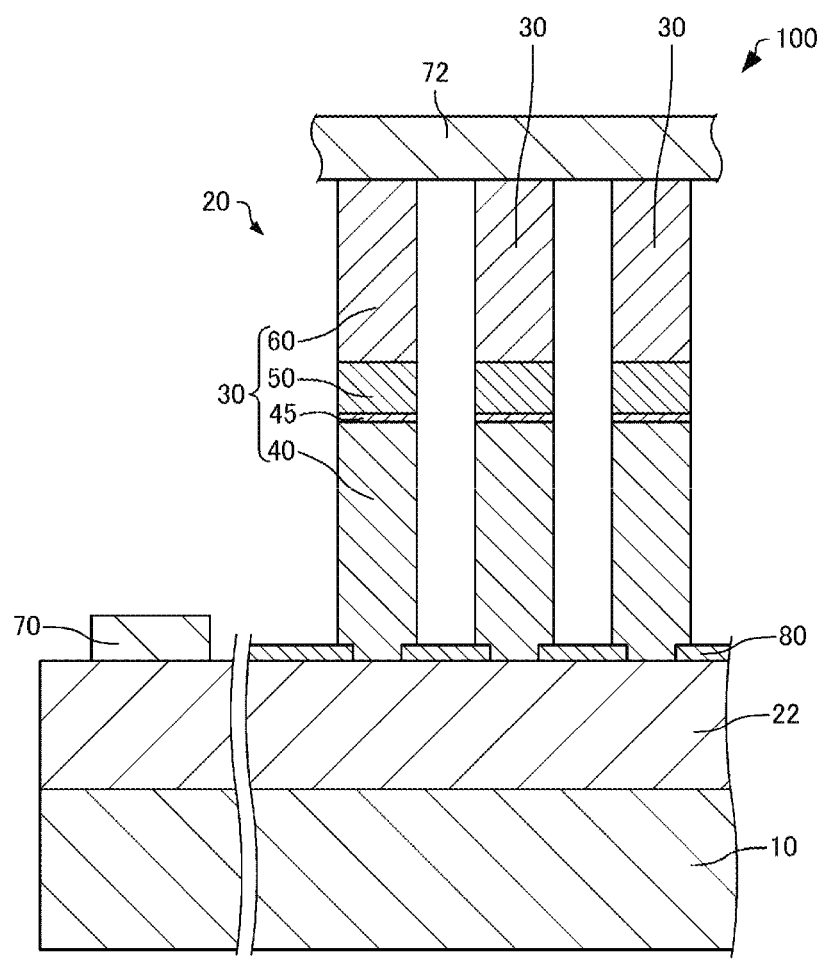
FIG. 1 is a cross-sectional view schematically showing the light emitting device according to the embodiment.

First, a light emitting device according to the present embodiment will be described with reference to the accompanying drawings. FIG. 1 is a cross-sectional view schematically showing a light emitting device 100 according to the present embodiment.

As shown in FIG. 1, the light emitting device 100 has a substrate 10, a laminated structure 20, a first electrode 70, and a second electrode 72.

The substrate 10 is, for example, an Si substrate, a GaN substrate, or a sapphire substrate.

The laminated structure 20 is provided to the substrate 10. In the illustrated example, the laminated structure 20 is disposed on the substrate 10. The laminated structure 20 has, for example, a buffer layer 22 and columnar parts 30. It should be noted that in FIG. 1, the columnar parts 30 are illustrated in a simplified manner for the sake of convenience.

In the present specification, when taking a light emitting layer 50 as a reference in a stacking direction of the laminated structure 20 (hereinafter also referred to simply as a "stacking direction"), the description will be presented defining a direction from the light emitting layer 50 toward a second GaN layer 60 as an "upward direction," and a direction from the light emitting layer 50 toward a first GaN layer 40 as a "downward direction." Further, a direction perpendicular to the stacking direction is also referred to as an "in-plane direction." Further, the "stacking direction of the laminated structure 20" means a stacking direction of the first GaN layer 40 and the light emitting layer 50 of the columnar part 30.

The buffer layer 22 is disposed on the substrate 10. The buffer layer 22 is, for example, an Si-doped n-type GaN layer. On the buffer layer 22, there is disposed a mask layer 80 for forming the columnar parts 30. The mask layer 80 is, for example, a silicon oxide layer, a titanium layer, a titanium oxide layer, or an aluminum oxide layer.

The columnar parts 30 are disposed on the buffer layer 22. The columnar parts 30 each have a columnar shape protruding upward from the buffer layer 22. The columnar part 30 is also referred to as, for example, a nano-column, a nanowire, a nano-rod, or a nano-pillar. A planar shape of the columnar part 30 is, for example, a polygon such as a regular hexagon, or a circle.

The diametrical size of the columnar part 30 is, for example, no smaller than 50 nm and no larger than 500 nm. By setting the diametrical size of the columnar part 30 to be no larger than 500 nm, it is possible to obtain the light emitting layer 50 made of crystal high in quality, and at the same time, it is possible to reduce a distortion inherent in the light emitting layer 50. Thus, it is possible to amplify light generated in the light emitting layer 50 with high efficiency. The columnar parts 30 are, for example, equal in diametrical size to each other.

It should be noted that when the planar shape of the columnar part 30 is a circle, the "diametrical size of the columnar part" means the diameter of the circle, and when the planar shape of the columnar part 30 is not a circular shape, the "diametrical size of the columnar part" means the diameter of the minimum encompassing circle. For example, when the planar shape of the columnar part 30 is a polygonal shape, the diametrical size of the columnar part is the diameter of a minimum circle including the polygonal shape inside, and when the planar shape of the columnar part 30 is an ellipse, the diametrical size of the columnar part 30 is the diameter of a minimum circle including the ellipse inside.

The number of the columnar parts 30 disposed is two or more. An interval between the columnar parts 30 adjacent to each other is, for example, no smaller than 1 nm and no larger than 500 nm. The plurality of columnar parts 30 is arranged at a predetermined pitch in a predetermined direction in a plan view from the stacking direction. The plurality of columnar parts 30 is arranged so as to form, for example, a triangular grid. It should be noted that the arrangement of the plurality of columnar parts 30 is not particularly limited, and the plurality of columnar parts 30 can be arranged to form a square grid. The plurality of columnar parts 30 can develop an effect of a photonic crystal.

It should be noted that the "pitch of the columnar parts" means a distance between the centers of the columnar parts 30 adjacent to each other along the predetermined direction. When the planar shape of the columnar part 30 is a circle, the "center of the columnar part" means the center of the circle, and when the planar shape of the columnar part 30 is not a circular shape, the "center of the columnar part" means the center of the minimum encompassing circle. For example, when the planar shape of the columnar part 30 is a polygonal shape, the center of the columnar part 30 is the center of a minimum circle including the polygonal shape inside, and when the planar shape of the columnar part 30 is an ellipse, the center of the columnar part 30 is the center of a minimum circle including the ellipse inside.

The columnar parts 30 each have the first GaN layer 40, a hexagonal crystal layer 45, the light emitting layer 50, and the second GaN layer 60.

The first GaN layer 40 is disposed on the buffer layer 22. The first GaN layer 40 is disposed between the substrate 10 and the light emitting layer 50. The first GaN layer 40 has a first conductivity type. The first GaN layer 40 is, for example, an Si-doped n-type GaN layer. Here, FIG. 2 is a cross-sectional view schematically showing the columnar part 30.

Figure 2:
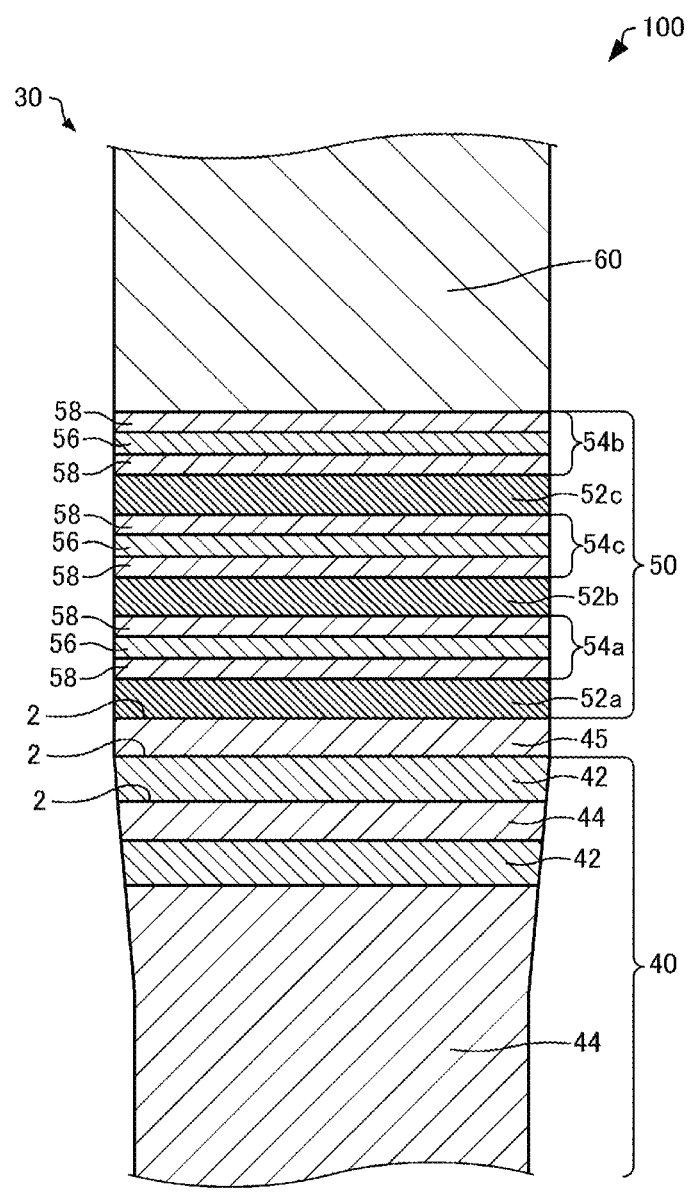
FIG. 2 is a cross-sectional view schematically showing a columnar part of the light emitting device according to the embodiment.

As shown in FIG. 2, the first GaN layer 40 has cubical crystal layers 42 each having a crystal structure of cubical crystal, and hexagonal crystal layers 44 each having a crystal structure of hexagonal crystal. The cubical crystal layers 42 are each a GaN layer having the crystal structure of the cubical crystal. The hexagonal crystal layers 44 are each a GaN layer having the crystal structure of the hexagonal crystal. In the illustrated example, there are disposed the two cubical crystal layers 42, and there are disposed the two hexagonal crystal layers 44. The numbers of the cubical crystal layers 42 and the hexagonal crystal layers 44 are not particularly limited. In the illustrated example, the plurality of cubical crystal layers 42 and the plurality of hexagonal crystal layers 44 are alternately stacked on one another. The cubical crystal layer 42 located the closest to the light emitting layer 50 out of the plurality of cubical crystal layers 42 is a first layer.

The hexagonal crystal layer 45 is disposed on the first GaN layer 40. The hexagonal crystal layer 45 is disposed between the cubical crystal layer 42 as the first layer, and a first well layer 52a. The hexagonal crystal layer 45 has contact with the first well layer 52a. The hexagonal crystal layer 45 is a GaN layer having the crystal structure of the hexagonal crystal. The hexagonal crystal layer 45 has the first conductivity type. The hexagonal crystal layer 45 is, for example, an Si-doped n-type GaN layer.

The first GaN layer 40 has a c-face region 2. In the illustrated example, an upper surface of each of the cubical crystal layers 42 is the c-face region 2. Since the upper surface of each of the cubical crystal layers 42 is the c-face region 2, it is possible to form the c-face region 2 on an upper surface of the hexagonal crystal layer 45. The c-face region 2 is parallel to, for example, an upper surface of the substrate 10. It should be noted that in the illustrated example, each of the hexagonal crystal layers 44 also has the c-face region 2.

The light emitting layer 50 is disposed on the first GaN layer 40. The light emitting layer 50 is disposed between the first GaN layer 40 and the second GaN layer 60. The light emitting layer 50 generates light in response to injection of an electrical current.

The light emitting layer 50 has i-type well layers and i-type barrier layers. In the illustrated example, there are disposed the three well layers as a first well layer 52a, a second well layer 52b, and a third well layer 52c. There are disposed the three barrier layers as a first barrier layer 54a, a second barrier layer 54b, a third barrier layer 54c. The numbers of the well layers and the barrier layers are not particularly limited. For example, the number of the well layers disposed can be one, can be two, or can also be four or more. The plurality of well layers and the plurality of barrier layers are alternately stacked on one another.

The light emitting layer 50 has a quantum well (MQW) structure constituted by, for example, the well layers 52a, 52b, and 52c and the plurality of barrier layers 54a, 54b, and 54c. The well layers 52a, 52b, and 52c are each an InGaN layer. The barrier layers 54a, 54b, and 54c are each a GaN layer.

The first well layer 52a is disposed between the substrate 10 and the second well layer 52b. The second well layer 52b is disposed between the first well layer 52a and the third well layer 52c. The third well layer 52c is disposed between the second well layer 52b and the second GaN layer 60. The well layers 52a, 52b, and 52c are arranged in the order of the first well layer 52a, the second well layer 52b, and the third well layer 52c from the first GaN layer 40 toward the second GaN layer 60.

The first barrier layer 54a is disposed between the first well layer 52a and the second well layer 52b. The second barrier layer 54b is disposed between the second well layer 52b and the second GaN layer 60. In the illustrated example, the second barrier layer 54b is disposed between the third well layer 52c and the second GaN layer 60. The third barrier layer 54c is disposed between the second well layer 52b and the third well layer 52c. The barrier layers 54a, 54b, and 54c are arranged in the order of the first barrier layer 54a, the third barrier layer 54c, and the second barrier layer 54b from the first GaN layer 40 toward the second GaN layer 60.

The crystal structure of each of the well layers 52a, 52b, and 52c of the light emitting layer 50 is the hexagonal crystal structure. The barrier layers 54a, 54b, and 54c each have a cubical crystal layer 56 having the crystal structure of the cubical crystal, and hexagonal crystal layers 58 each having the crystal structure of the hexagonal crystal. The cubical crystal layer 56 is a GaN layer having the crystal structure of the cubical crystal. The hexagonal crystal layers 58 are each a GaN layer having the crystal structure of the hexagonal crystal. There are disposed the two hexagonal crystal layers 58 in each of the barrier layers 54a, 54b, and 54c. It should be noted that the crystal structure of each of the light emitting layer 50 and the first GaN layer 40 can be identified by electron beam diffraction in TEM (Transmission Electron Microscope). In the illustrated example, the light emitting layer 50 has the c-face region.

The first barrier layer 54a has the hexagonal crystal layers 58 as a third layer and a fourth layer, and the cubical crystal layer 56 as a fifth layer disposed between the third layer and the fourth layer. The hexagonal crystal layer 58 as the third layer is disposed between the first well layer 52a and the cubical crystal layer 56 as the fifth layer. The hexagonal crystal layer 58 as the fourth layer is disposed between the second well layer 52b and the cubical crystal layer 56 as the fifth layer.

The second barrier layer 54b has the hexagonal crystal layers 58 as a sixth layer and a seventh layer, and the cubical crystal layer 56 as an eighth layer disposed between the sixth layer and the seventh layer. The hexagonal crystal layer 58 as the sixth layer is disposed between the second well layer 52b and the cubical crystal layer 56 as the eighth layer. The hexagonal crystal layer 58 as the seventh layer is disposed between the second GaN layer 60 and the cubical crystal layer 56 as the eighth layer.

The second GaN layer 60 is disposed on the light emitting layer 50. The second GaN layer 60 is a layer of a second conductivity type different from the first conductivity type. The second GaN layer 60 is, for example, an Mg-doped p-type GaN layer. The first GaN layer 40 and the second GaN layer 60 are cladding layers having a function of confining the light in the light emitting layer 50. It should be noted that although not shown in the drawing, it is possible to dispose a p-type AlGaN layer as an electron block layer between the light emitting layer 50 and the second GaN layer 60.

In the light emitting device 100, a pin diode is constituted by the p-type second GaN layer 60, the i-type light emitting layer 50 which is not intentionally doped with an impurity, and the n-type hexagonal crystal layer 45 and the n-type first GaN layer 40. In the light emitting device 100, when applying a forward bias voltage of the pin diode between the first electrode 70 and the second electrode 72, an electrical current is injected into the light emitting layer 50, and recombination of electrons and holes occurs in the light emitting layer 50. The recombination causes light emission. The light generated in the light emitting layer 50 propagates in an in-plane direction to form a standing wave due to the effect of the photonic crystal caused by the plurality of columnar parts 30, and is then gained by the light emitting layer 50 to cause laser oscillation. Then, the light emitting device 100 emits positive first-order diffracted light and negative first-order diffracted light as a laser beam in the stacking direction.

It should be noted that although not shown in the drawings, it is also possible to dispose a reflecting layer between the substrate 10 and the buffer layer 22, or below the substrate 10. The reflecting layer is, for example, a DBR (Distributed Bragg Reflector) layer. Due to the reflecting layer, it is possible to reflect the light generated in the light emitting layer 50, and thus, it is possible for the light emitting device 100 to emit the light only from the second electrode 72 side.

The first electrode 70 is disposed on the buffer layer 22. It is also possible for the buffer layer 22 to have ohmic contact with the first electrode 70. The first electrode 70 is electrically coupled to the first GaN layer 40. In the illustrated example, the first electrode 70 is electrically coupled to the first GaN layer 40 via the buffer layer 22. The first electrode 70 is one of the electrodes for injecting the electrical current into the light emitting layer 50. As the first electrode 70, there is used, for example, what is obtained by stacking a Cr layer, an Ni layer, and an Au layer in this order from the buffer layer 22 side.

The second electrode 72 is disposed on the second GaN layer 60. The second electrode 72 is electrically coupled to the second GaN layer 60. The second GaN layer 60 can have ohmic contact with the second electrode 72. The second electrode 72 is the other of the electrodes for injecting the electrical current into the light emitting layer 50. As the second electrode 72, there is used, for example, ITO (indium tin oxide).

The light emitting device 100 can exert, for example, the following functions and advantages.

In the light emitting device 100, the light emitting layer 50 has the first well layer 52a as the InGaN layer, the first GaN layer 40 has the c-face region 2, the first GaN layer 40 has the cubical crystal layer 42 as the first layer which has the crystal structure of the cubical crystal and forms the c-face region 2, and the hexagonal crystal layer 45 as the second layer having the crystal structure of the hexagonal crystal is disposed between the first layer and the first well layer 52a. Therefore, in the light emitting device 100, the possibility that the crystal defect caused by the lattice constant difference between the first well layer 52a and the first GaN layer 40 occurs can be reduced compared to when the hexagonal crystal layer is not disposed between the cubical crystal layer and the first well layer. As a result, it is possible to prevent electrical leakage and deterioration of luminous efficiency. Further, it is possible to increase the light confinement factor as the laser, and it is possible to reduce a threshold current.

It should be noted that the lattice constant in the a-axis direction is 3.25 Å in $In_{0.15}Ga_{0.85}N$, 3.19 Å in GaN as the hexagonal crystal, and 4.52 Å in GaN as the cubical crystal.

Further, in the light emitting device 100, since the GaN layer as the hexagonal crystal is used in order to decrease the lattice constant difference from the InGaN layer, it is possible to increase the difference in band-gap between the InGaN layer and the GaN layer. Thus, it is possible to concentrate the carriers on the InGaN layer. For example, when using the InGaN layer lower in atomic concentration of In than the InGaN layer of the well layer in order to decrease the lattice constant difference from the InGaN layer of the well layer, it is unachievable to sufficiently concentrate the carriers on the InGaN layer of the well layer in some cases.

In the light emitting device 100, the light emitting layer 50 has the second well layer 52b as the InGaN layer, and the first barrier layer 54a disposed between the first well layer 52a and the second well layer 52b, the first barrier layer 54a is a GaN layer, and the first well layer 52a is disposed between the substrate 10 and the second well layer 52b. The first barrier layer 54a has the hexagonal crystal layers 58 as the third layer and the fourth layer each having the crystal structure of the hexagonal crystal, and the cubical crystal layer 56 as the fifth layer which is disposed between the third layer and the fourth layer, and has the crystal structure of the cubical crystal, wherein the third layer is disposed between the first well layer 52a and the fifth layer, and the fourth layer is disposed between the second well layer 52b and the fifth layer. Therefore, in the light emitting device 100, it is possible to decrease the proportion of the area of the facet face region to the area of the c-face region 2 in the first barrier layer 54a compared to when the first barrier layer does not have the cubical crystal layer. Thus, it is possible to reduce the possibility that the balance of the distortion is lost in the in-plane direction of the light emitting layer 50 to generate the crystal defect. In the illustrated example, the first barrier layer 54a does not have the facet face region.

It should be noted that although not shown in the drawings, when the crystal defect caused by the fact that the balance of the distortion is lost does not occur even when the first barrier layer 54a does not have the cubical crystal layer 56, the first barrier layer 54a is not required to have the cubical crystal layer 56. It should be noted that when it is required to more surely prevent the occurrence of the crystal defect, it is preferable for the first barrier layer 54a to have the cubical crystal layer 56.

In the light emitting device 100, the light emitting layer 50 has the second barrier layer 54b disposed between the third well layer 52c and the second GaN layer 60, the second barrier layer 54b is the GaN layer, the second barrier layer 54b has the hexagonal crystal layers 58 as the sixth layer and the seventh layer each having the crystal structure of the hexagonal crystal, and the cubical crystal layer 56 as the eighth layer which is disposed between the sixth layer and the seventh layer, and has the crystal structure of the cubical crystal, the sixth layer is disposed between the third well layer 52c and the eighth layer, and the seventh layer is disposed between the second GaN layer 60 and the eighth layer. Therefore, in the light emitting device 100, it is possible to decrease the proportion of the area of the facet face region to the area of the c-face region 2 in the second barrier layer 54b compared to when the second barrier layer does not have the cubical crystal layer. Thus, it is possible to reduce the possibility that the balance of the distortion is lost in the in-plane direction of the light emitting layer 50 to generate the crystal defect. In the illustrated example, the second barrier layer 54b does not have the facet face region.

In the light emitting device 100, the hexagonal crystal layer 45 as the second layer can have the first conductivity type. Thus, it is possible to reduce the resistance of the second layer compared to when the second layer is the i-type.

It should be noted that although the example in which the first conductivity type is the n-type and the second conductivity type is the p-type is described above, it is possible to adopt a configuration in which the first conductivity type is the p-type, and the second conductivity type is the n-type.

Further, although the example in which the hexagonal crystal layer 45 has the first conductivity type is described above, the hexagonal crystal layer 45 can be the i-type which is not intentionally doped with an impurity. In this case, the hexagonal crystal layer 45 can be a barrier layer. When the hexagonal crystal layer 45 is the barrier layer, it is possible to increase the luminous efficiency in the light emitting layer 50. Further, it is possible to dispose the i-type cubical crystal layer between the cubical crystal layer 42 as the first layer and the hexagonal crystal layer 45. Even when the hexagonal crystal layer 45 is the barrier layer, the possibility that the crystal defect caused by the lattice constant difference between the first well layer 52a and the first GaN layer 40 occurs can be reduced by the hexagonal crystal layer 45.

2. Method of Manufacturing Light Emitting Device

Figure 3:
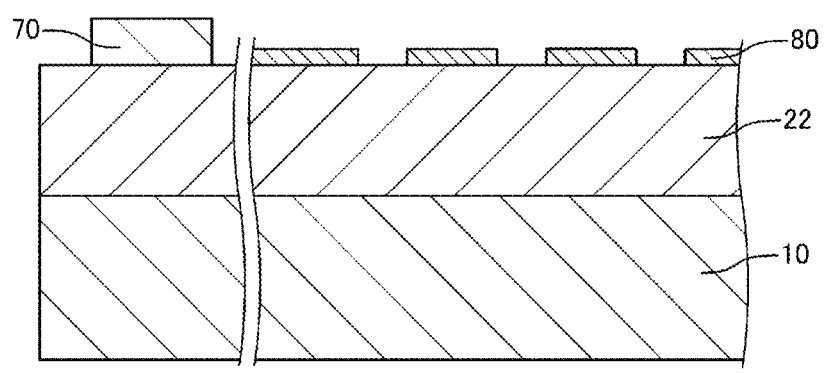
FIG. 3 is a cross-sectional view schematically showing a manufacturing process of the light emitting device according to the embodiment.

Then, a method of manufacturing the light emitting device 100 according to the present embodiment will be described with reference to the drawings. FIG. 3 is a cross-sectional view schematically showing the manufacturing process of the light emitting device 100 according to the present embodiment.

As shown in FIG. 3, the buffer layer 22 is grown epitaxially on the substrate 10. As the method of achieving the epitaxial growth, there can be cited, for example, an MOCVD (Metal Organic Chemical Vapor Deposition) method and an MBE (Molecular Beam Epitaxy) method.

Then, the mask layer 80 is formed on the buffer layer 22. The mask layer 80 is formed by deposition using, for example, an electron beam deposition method or a plasma chemical vapor deposition (CVD) method, and patterning with photolithography and etching.

As shown in FIG. 1, the first GaN layer 40, the hexagonal crystal layer 45, the light emitting layer 50, and the second GaN layer 60 are grown epitaxially in this order on the buffer layer 22 using the mask layer 80 as a mask. As the method of achieving the epitaxial growth, there can be cited, for example, the MOCVD method and the MBE method. Due to the present process, it is possible to form the plurality of columnar parts 30.

In the epitaxial growth of the first GaN layer 40, the growth of the cubical crystal layers 42 is performed in the condition in which the ratio of Ga to N becomes higher than in the growth of the hexagonal crystal layers 44. By controlling the ratio of Ga to N, it is possible to control the crystal structure of the first GaN layer 40.

In the epitaxial growth of the hexagonal crystal layer 45, the growth of the hexagonal crystal layer 45 is performed in the condition in which the ratio of Ga to N becomes lower than in the growth of the cubical crystal layers 42. By controlling the ratio of Ga to N, it is possible to control the crystal structure of the first hexagonal crystal layer 45.

In the epitaxial growth of the barrier layers 54a, 54b, and 54c of the light emitting layer 50, the growth of the cubical crystal layers 56 is performed in the condition in which the ratio of Ga to N becomes higher than in the growth of the hexagonal crystal layers 58. By controlling the ratio of Ga to N, it is possible to control the crystal structure of the barrier layers 54a, 54b, and 54c.

Then, the first electrode 70 is formed on the buffer layer 22, and the second electrode 72 is formed on the second GaN layer 60. The first electrode 70 and the second electrode 72 are formed using, for example, a vacuum deposition method. It should be noted that the order of forming the first electrode 70 and the second electrode 72 is not particularly limited.

Due to the process described hereinabove, it is possible to manufacture the light emitting device 100.

3. Modified Example of Light Emitting Device

Figure 4:
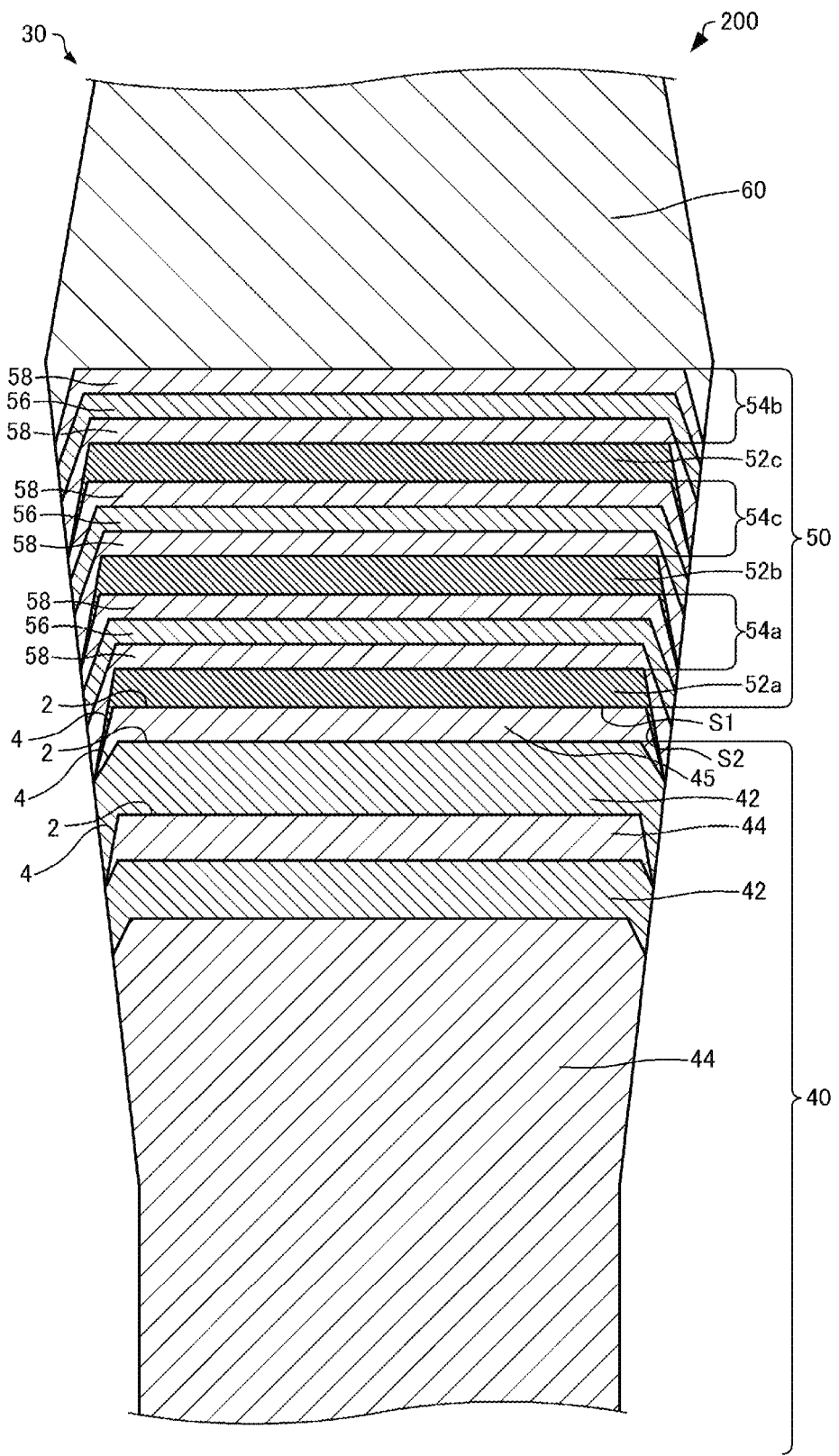
FIG. 4 is a cross-sectional view schematically showing a columnar part of a light emitting device according to a modified example of the embodiment.

Then, a light emitting device according to a modified example of the present embodiment will be described with reference to the drawings. FIG. 4 is a cross-sectional view schematically showing one of the columnar parts 30 of a light emitting device 200 according to the modified example of the present embodiment.

Hereinafter, in the light emitting device 200 according to the modified example of the present embodiment, the constituents thereof having substantially the same functions as those of the constituents of the light emitting device 100 according to the present embodiment described above will be denoted by the same reference symbols, and detailed descriptions thereof will be omitted.

As shown in FIG. 2, in the light emitting device 100 described above, the first GaN layer 40 has the c-face region 2, but does not have a facet face region 4. Similarly, the hexagonal crystal layer 45 has the c-face region 2, but does not have the facet face region 4.

In contrast, in the light emitting device 200, the first GaN layer 40 has the c-face region 2 and the facet face region 4 as shown in FIG. 4. Similarly, the hexagonal crystal layer 45 has the c-face region 2 and the facet face region 4. The facet face region 4 is tilted with respect to the c-face region 2. It should be noted that in the illustrated example, each of the hexagonal crystal layers 44 also has the c-face area 2 and the facet face region 4.

The light emitting layer 50 is disposed in the c-face region 2 and the facet face region 4 of the hexagonal crystal layer 45. An area S1 of the light emitting layer 50 disposed in the c-face region 2 of the hexagonal crystal layer 45 is larger than an area S2 of the light emitting layer 50 disposed in the facet face region 4 of the hexagonal crystal layer 45. The area S1 is the area of a contact surface with the c-face region 2 of the light emitting layer 50. The area S2 is the area of a contact surface with the facet face region 4 of the light emitting layer 50. In the illustrated example, the light emitting layer 50 has the c-face region and the facet face region.

In the epitaxial growth of the first GaN layer 40 and the hexagonal crystal layer 45, by controlling deposition temperature, a deposition speed, a composition, and so on, it is possible to control the ratio between the c-face region 2 and the facet face region 4.

In the light emitting device 200, since the area S1 is larger than the area S2, it is possible to make it easy to keep the balance of the distortion in the in-plane direction of the light emitting layer 50 compared to when the area S1 is smaller than the area S2.

4. Projector

Figure 5:
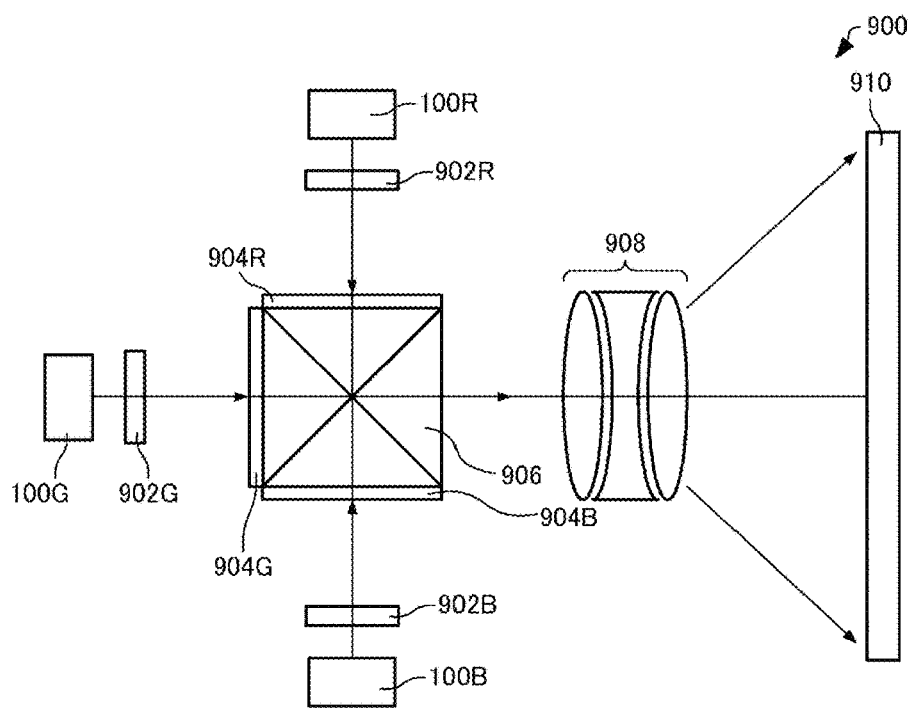
FIG. 5 is a diagram schematically showing a projector according to the embodiment.

Then, a projector according to the present embodiment will be described with reference to the drawings. FIG. 5 is a diagram schematically showing a projector 900 according to the present embodiment.

The projector 900 has, for example, the light emitting device 100 as a light source.

The projector 900 includes a housing not shown, a red light source 100R, a green light source 100G, and a blue light source 100B which are disposed inside the housing, and respectively emit red light, green light, and blue light. It should be noted that in FIG. 5, the red light source 100R, the green light source 100G, and the blue light source 100B are simplified for the sake of convenience.

The projector 900 further includes a first optical element 902R, a second optical element 902G, a third optical element 902B, a first light modulation device 904R, a second light modulation device 904G, a third light modulation device 904B, and a projection device 908 all installed inside the housing. The first light modulation device 904R, the second light modulation device 904G, and the third light modulation device 904B are each, for example, a transmissive liquid crystal light valve. The projection device 908 is, for example, a projection lens.

The light emitted from the red light source 100R enters the first optical element 902R. The light emitted from the red light source 100R is collected by the first optical element 902R. It should be noted that the first optical element 902R can be provided with other functions than the light collection. The same applies to the second optical element 902G and the third optical element 902B described later.

The light collected by the first optical element 902R enters the first light modulation device 904R. The first light modulation device 904R modulates the incident light in accordance with image information. Then, the projection device 908 projects an image formed by the first light modulation device 904R on a screen 910 in an enlarged manner.

The light emitted from the green light source 100G enters the second optical element 902G. The light emitted from the green light source 100G is collected by the second optical element 902G.

The light collected by the second optical element 902G enters the second light modulation device 904G. The second light modulation device 904G modulates the incident light in accordance with the image information. Then, the projection device 908 projects an image formed by the second light modulation device 904G on the screen 910 in an enlarged manner.

The light emitted from the blue light source 100B enters the third optical element 902B. The light emitted from the blue light source 100B is collected by the third optical element 902B.

The light collected by the third optical element 902B enters the third light modulation device 904B. The third light modulation device 904B modulates the incident light in accordance with the image information. Then, the projection device 908 projects an image formed by the third light modulation device 904B on the screen 910 in an enlarged manner.

Further, it is possible for the projector 900 to include a cross dichroic prism 906 for combining the light emitted from the first light modulation device 904R, the light emitted from the second light modulation device 904G, and the light emitted from the third light modulation device 904B with each other to guide the light thus combined to the projection device 908.

The three colors of light respectively modulated by the first light modulation device 904R, the second light modulation device 904G, and the third light modulation device 904B enter the cross dichroic prism 906. The cross dichroic prism 906 is formed by bonding four rectangular prisms to each other, and is provided with a dielectric multilayer film for reflecting the red light and a dielectric multilayer film for reflecting the blue light disposed on the inside surfaces. The three colors of light are combined with each other by these dielectric multilayer films, and thus, the light representing a color image is formed. Then, the light thus combined is projected on the screen 910 by the projection device 908, and thus, an enlarged image is displayed.

It should be noted that it is possible for the red light source 100R, the green light source 100G, and the blue light source 100B to directly form the images by controlling the light emitting devices 100 as the pixels of the image in accordance with the image information without using the first light modulation device 904R, the second light modulation device 904G, and the third light modulation device 904B. Then, it is also possible for the projection device 908 to project the images formed by the red light source 100R, the green light source 100G, and the blue light source 100B on the screen 910 in an enlarged manner.

Further, although the transmissive liquid crystal light valves are used as the light modulation devices in the example described above, it is also possible to use light valves other than the liquid crystal light valves, or to use reflective light valves. As such light valves, there can be cited, for example, reflective liquid crystal light valves and Digital Micromirror Device™. Further, the configuration of the projection device is appropriately modified in accordance with the type of the light valves used.

Further, it is also possible to apply the light source to a light source device of a scanning type image display device having a scanning unit as an image forming device for scanning the surface of the screen with the light from the light source to thereby display an image with a desired size on the display surface.

The light emitting devices according to the embodiment described above can also be used for other devices than projectors. As the applications other than projectors, there can be cited, for example, a light source of indoor and outdoor illumination, a backlight for a display, a laser printer, a scanner, an in-car light, sensing equipment using light, communication equipment, and so on. Further, the light emitting device according to the embodiment described above can also be applied to a light emitting element of an LED (Light Emitting Diode) display having microscopic light emitting elements disposed in an array to display an image.

5. Practical Example and Comparative Example 5.1. Manufacture of Sample

The i-type InGaN layers as the well layers and the i-type GaN layers as the barrier layers were alternately stacked on the n-type GaN layer.

In Practical Example 1, the GaN layer of the n-type hexagonal crystal was formed between the GaN layer of the n-type cubical crystal and the InGaN layer as the well layer. Further, the barrier layer was formed to have the two GaN layers of the hexagonal crystal and the GaN layer of the cubical crystal sandwiched between the two GaN layers of the hexagonal crystal. In other words, in Practical Example 1, the InGaN layer as the well layer and the GaN layer of the cubical crystal do not have contact with each other. The InGaN layer has contact with the GaN layer of the hexagonal crystal.

In Comparative Example 1, the InGaN layer as the well layer was formed on the GaN layer of the n-type cubical crystal. Further, the barrier layer was formed only of the GaN layer of the hexagonal crystal. In other words, in Comparative Example 1, the InGaN layer as the well layer and the GaN layer of the cubical crystal have contact with each other.

5.2. TEM Observation

Figure 6:
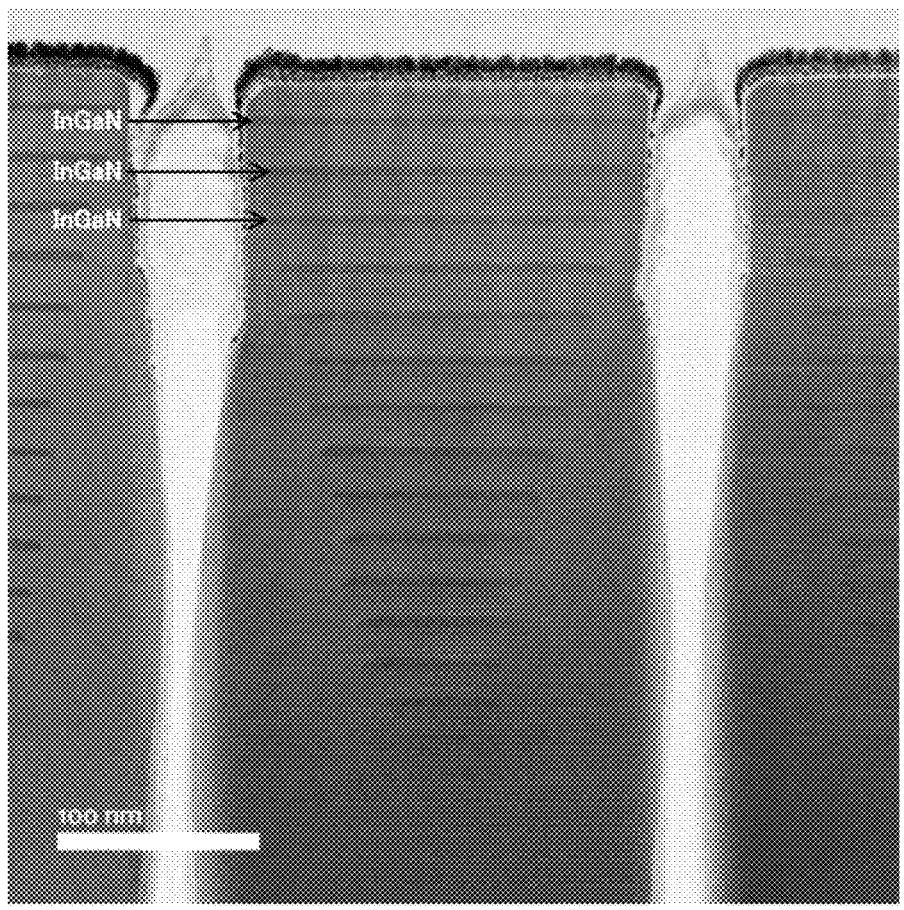
FIG. 6 is a diagram showing a TEM image in Practical Example 1.
Figure 7:
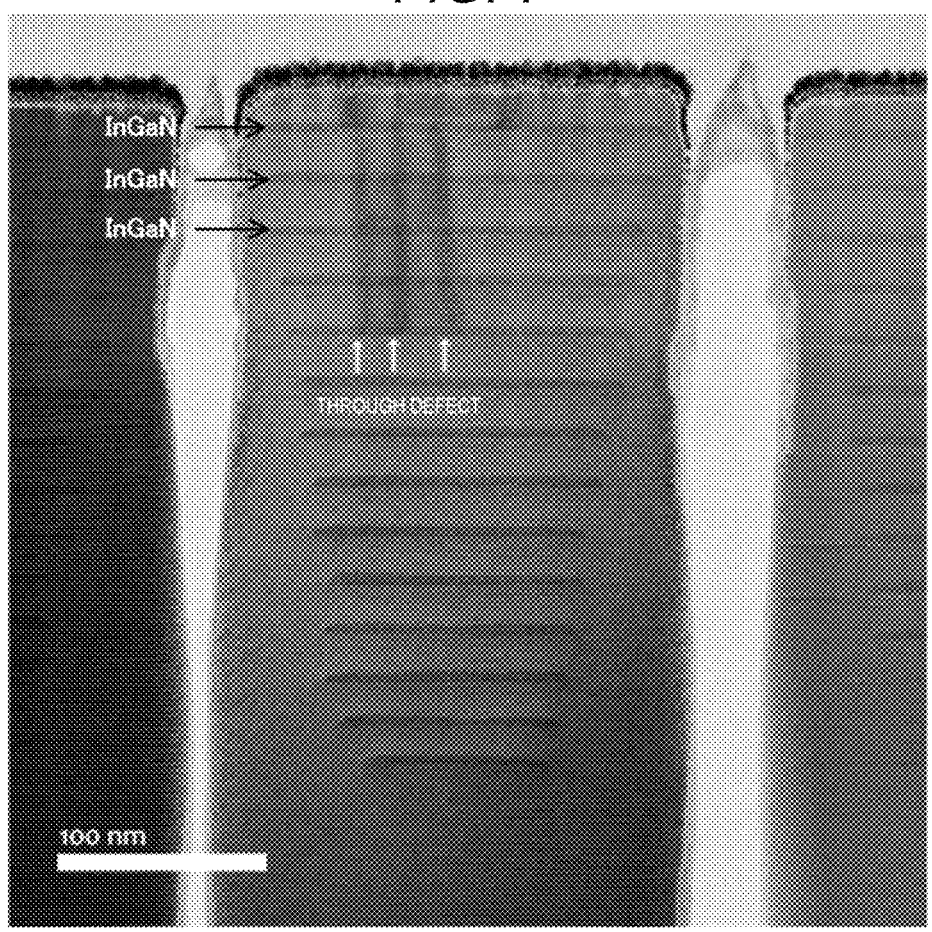
FIG. 7 is a diagram showing a TEM image in Comparative Example 1.

The TEM observation of Practical Example 1 and the Comparative Example 1 was conducted. FIG. 6 shows a TEM image in Practical Example 1. FIG. 7 shows a TEM image in Comparative Example 1. In FIG. 6 and FIG. 7, the plurality of black horizontal lines represents the InGaN layers.

In Comparative Example 1, three through defects were confirmed in the vertical direction as shown in FIG. 7. These are the crystal defects caused by the lattice constant difference between the InGaN layer and the GaN layer of the cubical crystal. In contrast, as shown in FIG. 6, such through defects as confirmed in Comparative Example 1 are not confirmed in Practical Example 1. It was found out that the occurrence of the through defect can be prevented by making the InGaN layer have contact with the GaN layer of the hexagonal crystal.

The embodiment and the modified example described above are illustrative only, and the present disclosure is not limited to the embodiment and the modified example. For example, it is also possible to arbitrarily combine the embodiment and the modified example with each other.

The present disclosure includes configurations substantially the same as the configuration described as the embodiment, for example, configurations having the same function, the same way, and the same result, or configurations having the same object and the same advantage. Further, the present disclosure includes configurations obtained by replacing a non-essential part of the configuration described as the embodiment. Further, the present disclosure includes configurations providing the same functions and advantages, and configurations capable of achieving the same object as those of the configuration described as the embodiment. Further, the present disclosure includes configurations obtained by adding known technologies to the configuration described as the embodiment.

The following contents are derived from the embodiment and the modified example described above.

A light emitting device according to an aspect includes a substrate, and a laminated structure provided to the substrate, and including a columnar part, wherein the columnar part includes a first GaN layer having a first conductivity type, a second GaN layer having a second conductivity type different from the first conductivity type, and a light emitting layer disposed between the first GaN layer and the second GaN layer, the first GaN layer is disposed between the substrate and the light emitting layer, the light emitting layer has a first well layer as an InGaN layer, the first GaN layer has a c-face region, the first GaN layer has a crystal structure of a cubical crystal, and has a first layer constituting the c-face region, and a second layer as a GaN layer having a crystal structure of a hexagonal crystal is disposed between the first layer and the first well layer.

According to this light emitting device, it is possible to decrease the possibility that the crystal defect caused by the lattice constant difference between the first well layer and the first GaN layer occurs.

In the light emitting device according to the aspect, the light emitting layer may include a second well layer as an InGaN layer, and a first barrier layer disposed between the first well layer and the second well layer, the first barrier layer may be a GaN layer, the first well layer may be disposed between the substrate and the second well layer, the first barrier layer may include a third layer and a fourth layer each having a crystal structure of the hexagonal crystal, and a fifth layer which is disposed between the third layer and the fourth layer, and has a crystal structure of the cubical crystal, the third layer may be disposed between the first well layer and the fifth layer, and the fourth layer may be disposed between the second well layer and the fifth layer.

According to this light emitting device, it is possible to decrease the ratio of an area of a facet face region to an area of the c-face region in the first barrier layer.

In the light emitting device according to the aspect, the light emitting layer may have a second barrier layer disposed between the second well layer and the second GaN layer, the second barrier layer may be a GaN layer, the second barrier layer may include a sixth layer and a seventh layer each having a crystal structure of the hexagonal crystal, and an eighth layer which is disposed between the sixth layer and the seventh layer, and has a crystal structure of the cubical crystal, the sixth layer may be disposed between the second well layer and the eighth layer, and the seventh layer may be disposed between the second GaN layer and the eighth layer.

According to this light emitting device, it is possible to decrease the ratio of the area of the facet face region to the area of the c-face region in the second barrier layer.

In the light emitting device according to the aspect, the second layer may have a c-face region and a facet face region, and the area of the light emitting layer disposed in the c-face region of the second layer may be larger than the area of the light emitting layer disposed in the facet face region of the second layer.

According to this light emitting device, it is possible to make it easy to keep the balance of the distortion in the in-plane direction of the light emitting layer.

In the light emitting device according to the aspect, the second layer may have the first conductivity type.

According to this light emitting device, it is possible to decrease the resistance of the second layer.

In the light emitting device according to the aspect, the second layer may be a barrier layer.

According to this light emitting device, it is possible to increase the luminous efficiency in the light emitting layer due to the second layer.

A projector according to another aspect includes the light emitting device according to the above aspect.

What is claimed is:

1. A light emitting device comprising:
   a substrate; and
   a laminated structure provided to the substrate, and including a columnar part, wherein
   the columnar part includes
      a first GaN layer having a first conductivity type,
      a second GaN layer having a second conductivity type different from the first conductivity type, and
      a light emitting layer disposed between the first GaN layer and the second GaN layer,
   the first GaN layer is disposed between the substrate and the light emitting layer,
   the light emitting layer has a first well layer as an InGaN layer,
   the first GaN layer has a c-face region,
   the first GaN layer has a crystal structure of a cubical crystal, and has a first layer constituting the c-face region, and
   a second layer as a GaN layer having a crystal structure of a hexagonal crystal is disposed between the first layer and the first well layer.

2. The light emitting device according to claim 1, wherein the light emitting layer includes
   a second well layer as an InGaN layer, and
   a first barrier layer disposed between the first well layer and the second well layer,
   first barrier layer is a GaN layer,
   first well layer is disposed between the substrate and the second well layer,
   first barrier layer includes
      a third layer and a fourth layer each having a crystal structure of a hexagonal crystal, and
      a fifth layer which is disposed between the third layer and the fourth layer, and has a crystal structure of a cubical crystal,
   the third layer is disposed between the first well layer and the fifth layer, and
   the fourth layer is disposed between the second well layer and the fifth layer.

3. The light emitting device according to claim 2, wherein
   the light emitting layer has a second barrier layer disposed between the second well layer and the second GaN layer,
   the second barrier layer is a GaN layer,
   the second barrier layer includes
      a sixth layer and a seventh layer each having a crystal structure of a hexagonal crystal, and
      an eighth layer which is disposed between the sixth layer and the seventh layer, and has a crystal structure of a cubical crystal,
   the sixth layer is disposed between the second well layer and the eighth layer, and
   the seventh layer is disposed between the second GaN layer and the eighth layer.

4. The light emitting device according to claim 1, wherein
   the second layer has a c-face region and a facet face region, and
   an area of the light emitting layer disposed in the c-face region of the second layer is larger than an area of the light emitting layer disposed in the facet face region of the second layer.

5. The light emitting device according to claim 1, wherein the second layer has the first conductivity type.

6. The light emitting device according to claim 1, wherein the second layer is a barrier layer.

7. A projector comprising:
   the light emitting device according to claim 1.

* * * * *